(12) United States Patent
Park et al.

(10) Patent No.: US 8,552,430 B2
(45) Date of Patent: Oct. 8, 2013

(54) THIN-FILM TRANSISTOR ARRAY SUBSTRATE, ORGANIC LIGHT-EMITTING DISPLAY INCLUDING THE SAME AND METHOD OF MANUFACTURING THE SAME

(75) Inventors: Jong-Hyun Park, Yongin (KR); Chun-Gi You, Yongin (KR); Sun Park, Yongin (KR); Yul-Kyu Lee, Yongin (KR); Sang-Ho Moon, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/349,440

(22) Filed: Jan. 12, 2012

(65) Prior Publication Data

US 2013/0037812 A1    Feb. 14, 2013

(30) Foreign Application Priority Data

Aug. 9, 2011  (KR) ..................... 10-2011-0079147

(51) Int. Cl.
*H01L 29/04* (2006.01)
*H01L 31/20* (2006.01)

(52) U.S. Cl.
USPC .................. 257/59; 257/40; 257/68; 257/71; 438/34; 438/158

(58) Field of Classification Search
USPC .......... 257/40, 59, 68, 71, E51.006, E33.053, 257/E21.412; 438/34, 158
See application file for complete search history.

(56) References Cited

U.S. PATENT DOCUMENTS

2012/0146004 A1*  6/2012  Lee et al. ................. 257/40

FOREIGN PATENT DOCUMENTS

KR    10-2006-0057945 A    5/2006
KR      10-0865258 B1    10/2008

* cited by examiner

*Primary Examiner* — Theresa T Doan
(74) *Attorney, Agent, or Firm* — Knobbe, Martens, Olson & Bear LLP (57) ABSTRACT

A thin-film transistor array substrate is disclosed. In one embodiment, the transistor includes a capacitor including a lower electrode disposed on the same layer as an active layer and an upper electrode disposed on the same layer as a gate electrode. The transistor may also include a first insulating layer disposed between the active layer and the gate electrode and between the lower and upper electrodes, the first insulating layer not being disposed on a perimeter of the lower electrode. The transistor may further include a second insulating layer between the first insulating layer and the source and drain electrodes, the second insulating layer not being disposed on perimeters of the upper and lower electrodes.

18 Claims, 8 Drawing Sheets

THIN-FILM TRANSISTOR ARRAY SUBSTRATE, ORGANIC LIGHT-EMITTING DISPLAY INCLUDING THE SAME AND METHOD OF MANUFACTURING THE SAME

CROSS-REFERENCE TO RELATED PATENT APPLICATION

This application claims the benefit of Korean Patent Application No. 10-2011-0079147, filed on Aug. 9, 2011, in the Korean Intellectual Property Office, the disclosure of which is incorporated herein in its entirety by reference.

BACKGROUND

1. Field

The described technology generally relates to a thin-film transistor array substrate, an organic light-emitting display including the array substrate, and a method of manufacturing the substrate.

2. Description of the Related Technology

Flat panel displays, such as organic light-emitting displays or liquid crystal displays (LCDs), include thin film transistors (TFTs), capacitors, and wirings for connecting the TFTs and the capacitors.

The TFTs, the capacitors, and the wirings that are formed in fine patterns are disposed on a substrate on which flat panel displays are to be manufactured. A photolithography process whereby patterns are transferred using a mask is generally used in forming fine patterns on the substrate.

According to the photolithography process, a photoresist is uniformly applied onto the substrate on which fine patterns are to be formed, is exposed using exposure equipment, such as a stepper, and the exposed photoresist is developed. After the photoresist has been developed such that portions of the photoresist have been removed, the patterns formed on the substrate by the remnant photoresist are etched, and the unnecessary photoresist is removed after the patterns have been formed.

In the process of transferring the patterns using the mask, the mask including necessary patterns has to be prepared. Thus, as the number of processes using the mask increases, manufacturing costs increase. In addition, a process of manufacturing a flat display is complicated due to the complexity of the mask processes, and manufacturing time of the flat display increases, and thus, overall manufacturing costs increase.

SUMMARY

One inventive aspect is a thin-film transistor array substrate that may be easily manufactured and has signal transmission of high quality, an organic light-emitting display including the thin-film transistor array substrate, and a method of manufacturing the thin-film transistor array substrate. Another aspect is a thin-film transistor array substrate which may include: a thin film transistor disposed on a substrate and comprising an active layer, a gate electrode, and source and drain electrodes; a capacitor comprising a lower electrode disposed on the same layer as the active layer and an upper electrode disposed on the same layer as the gate electrode; a pixel electrode disposed on the same layer as the gate electrode and the upper electrode and connected to one of the source electrode and the drain electrode; a first insulating layer disposed between the active layer and the gate electrode and between the lower electrode and the upper electrode, the first insulating layer not being disposed on a perimeter of the lower electrode; a second insulating layer between the first insulating layer and the source and drain electrodes, the second insulating layer not being disposed on perimeters of the upper electrode and the lower electrode; and a third insulating layer covering the source and drain electrodes and the upper electrode and exposing the pixel electrode.

The active layer and the lower electrode may include a semiconductor material doped with an ion impurity.

The gate electrode may include a first layer comprising a transparent conductive material and a second layer comprising metal.

The pixel electrode and the upper electrode may include a transparent conductive material.

The transparent conductive material may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first insulating layer and the second insulating layer may include the same etching surface.

A gap may be formed between the etching surface and the lower electrode.

The third insulating layer may be disposed in the gap.

The third insulating layer may directly contact the perimeter of the lower electrode in which the first insulating layer and the second insulating layer may be not disposed.

The first insulating layer and the second insulating layer may include an organic insulating layer.

The third insulating layer may be an organic insulating layer.

A wiring may be disposed on the same layer as the lower electrode and may be connected to the lower electrode, and the first insulating layer may be not formed on a connection portion in which the lower electrode and the wiring may be connected to each other.

The wiring and the connection portion may include a semiconductor material doped with an ion impurity.

A stepped portion may be formed on the etching surface of the first insulating layer interposed between the upper electrode and the lower electrode.

Another aspect is an organic light-emitting display including: a thin film transistor disposed on a substrate and comprising an active layer, a gate electrode, and source and drain electrodes; a capacitor comprising a lower electrode disposed on the same layer as the active layer and an upper electrode disposed on the same layer as the gate electrode; a pixel electrode disposed on the same layer as the gate electrode and the upper electrode and connected to one of the source electrode and the drain electrode; a first insulating layer disposed between the active layer and the gate electrode and between the lower electrode and the upper electrode, the first insulating layer not being disposed on a perimeter of the lower electrode; a second insulating layer between the first insulating layer and the source and drain electrodes, the second insulating layer not being disposed on perimeters of the upper electrode and the lower electrode; a third insulating layer covering the source and drain electrodes and the upper electrode and exposing the pixel electrode; an organic emission layer disposed on the pixel electrode; and an opposite electrode disposed on the organic emission layer.

The opposite electrode may include a reflection electrode that reflects light emitted from the organic emission layer.

The third insulating layer may directly contact the perimeter of the lower electrode in which the first insulating layer and the second insulating layer are not disposed.

The lower electrode may include a semiconductor material doped with an ion impurity, and a region that is not doped with an ion impurity is between the lower electrode in which the first insulating layer is disposed and the perimeter of the lower electrode in which the first insulating layer is not disposed.

Another aspect is a method of manufacturing a thin-film transistor array substrate, the method including: performing a first mask process of forming a semiconductor layer on a substrate and patterning the semiconductor layer to form an active layer of a thin film transistor and a lower electrode of a capacitor; performing a second mask process of forming a first insulating layer, sequentially stacking a transparent conductive material and a first metal on the first insulating layer and patterning the transparent conductive material and the first metal to form a pixel electrode on which the transparent conductive material and the first metal are sequentially stacked, a gate electrode of the thin film transistor, and an upper electrode of the capacitor; performing a third mask process of forming a second insulating layer and forming a contact hole through which the pixel electrode, source and drain regions of the active layer, and perimeters of the upper electrode and the lower electrode are exposed; performing a fourth mask process of forming a second metal on a resultant structure of the third mask process and patterning the second metal to form a source electrode and a drain electrode that respectively contact the source region and the drain region and to remove the first metal stacked on the pixel electrode and the second metal formed on the upper electrode; removing an impurity formed on the perimeter of the lower electrode; and performing a fifth mask process of forming a third insulating layer and removing the third insulating layer on the pixel electrode.

The performing of the first mask process may include patterning the semiconductor layer to simultaneously form a wiring on the same layer as the lower electrode to be connected to the lower electrode.

After the performing of the second mask process, the source and drain regions and the wiring may be doped with an ion impurity.

The performing of the third mask process may include simultaneously etching the first insulating layer and the second insulating layer.

The performing of the third mask process may include forming a gap between an etching surface of the first and second insulating layers and the lower electrode.

The performing of the fourth mask process may include performing a first etching process of etching the second metal and performing a second etching process of removing the first metal on the pixel electrode and the upper electrode.

The performing of the fourth mask process may include forming the second metal of the same material as the first metal and simultaneously etching the first metal and the second metal.

The removing of the impurity formed on the perimeter of the lower electrode may be dry-etching.

The impurity may include a compound of the semiconductor layer and the second metal.

After the performing of the fourth mask process, the lower electrode may be doped with an ion impurity.

DETAILED DESCRIPTION

Embodiments will now be described more fully with reference to the accompanying drawings.

Figure 1:
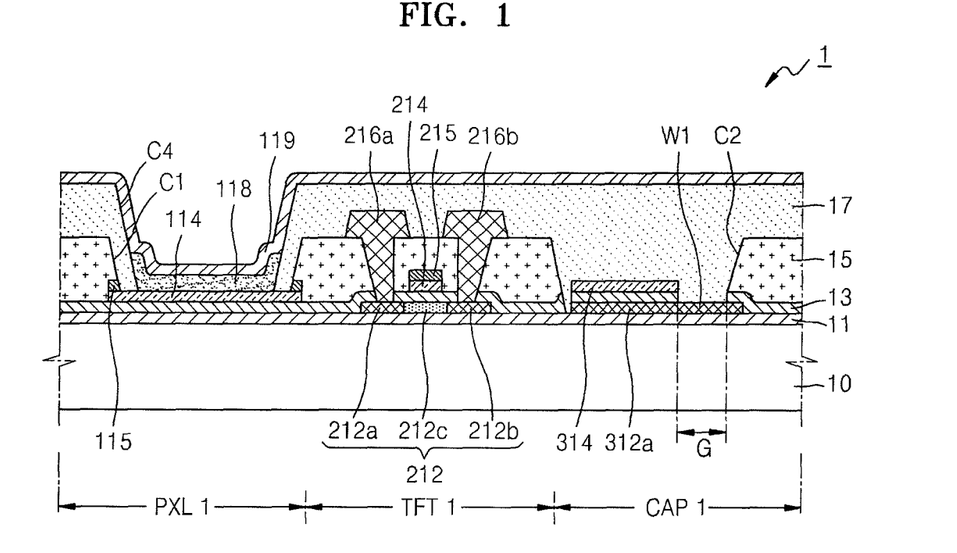
FIG. 1 is a schematic cross-sectional view of an organic light-emitting display according to an embodiment.

FIG. 1 is a schematic cross-sectional view of an organic light-emitting display 1 according to an embodiment. Referring to FIG. 1, on a substrate 10 of the organic light-emitting display 1 illustrated in FIG. 1, there are a pixel region PXL1 in which an organic emission layer 118 is formed, a transistor region TFT1 in which a thin film transistor is disposed, and a capacitor region CAP1 in which a capacitor is disposed.

In the transistor region TFT1, an active layer 212 of a thin film transistor and a buffer layer 11 are formed on the substrate 10. The active layer 212 may be formed of a semiconductor including amorphous silicon or polysilicon. The active layer 212 includes a channel region 212c and a source region 212a and a drain region 212b which are disposed outside the channel region 212c. The source region 212a and the drain region 212b are doped with ion impurities.

A first gate electrode 214 and a second gate electrode 215 are sequentially disposed on the active layer 212 and may include a transparent conductive material at a position that corresponds to the channel region 212c of the active layer 212, with a first insulating layer 13 as a gate insulating layer between the first and second gate electrodes 214 and 215.

A source electrode 216a and a drain electrode 216b are disposed on the second gate electrode 215 and respectively contact the source region 212a and the drain region 212b of the active layer 212, with a second insulating layer 15 as an interlayer dielectric layer between the source electrode 216a and the drain electrode 216b.

A third insulating layer 17 is formed on the second insulating layer 15 so as to cover the source electrode 216a and the drain electrode 216b.

Each of the first and second insulating layers 13 and 15 may be formed as an inorganic insulating layer, and the third insulating layer 17 may be formed as an organic insulating layer. The third insulating layer 17 may include commonly-used polymer, such as polymethylmethacrylate (PMMA) or polystyrene (PS), a polymer derivative having a phenol group, acryl-based polymer, imide-based polymer, aryl ether-based polymer, amide-based polymer, fluorine-based polymer, p-xylene-based polymer, vinyl alcohol-based polymer, or a blend thereof.

In the pixel region PXL1 illustrated in FIG. 1, a first pixel electrode 114 is disposed on the substrate 10, the buffer layer 11. In one embodiment, the first insulating layer 13 and is formed of the same transparent conductive material as that of the first gate electrode 214.

The first pixel electrode 114 may be formed of a transparent conductive material, and light may be emitted from the first pixel electrode 114. The transparent conductive material may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The organic emission layer 118 may be formed on the first pixel electrode 114, and light may be emitted from the organic emission layer 118 towards the substrate 10 via the first pixel electrode 114 formed of the transparent conductive material.

The buffer layer 11 and the first insulating layer 13 that are disposed below the first pixel electrode 114 alternatively include materials having different refractive indices and serve as a distributed brag reflector (DBR) so that luminous efficiency of light emitted from the organic emission layer 118 is improved. The buffer layer 11 and the first insulating layer 13 may be formed of $SiO_2$, SiNx, or the like. Although the first insulating layer 13 and the buffer layer 11 are respectively formed as one layer in the present embodiment, each of the first insulating layer 13 and the buffer layer 11 may be formed as a plurality of layers.

The second insulating layer 15 is formed at a perimeter of a second pixel electrode 115, and a first contact hole C1 through which the first pixel electrode 114 is exposed is formed in the second insulating layer 15. The third insulating layer 17 is formed on the second insulating layer 15, and a fourth contact hole C4 through which the first pixel electrode 114 is exposed is formed in the third insulating layer 17. The organic emission layer 118 is formed in the fourth contact hole C4.

The organic emission layer 118 may be formed of an organic material having a low molecular weight or a polymer organic material. When the organic emission layer 118 is formed of an organic material having a low molecular weight, a hole transport layer (HTL), a hole injection layer (HIL), an electron transport layer (ETL), and an electron injection layer (EIL), and the like may be stacked on the organic emission layer 118. Besides these layers, a variety of layers may be stacked on the organic emission layer 118, if necessary. In this regard, available organic materials may be copper phthalocyanine (CuPc), N(N'-Di(naphthalene-1-yl)-N), N'-diphenyl-benzidine (NPB), tris-8-hydroxyquinoline aluminum) (Alq3), and the like. When the organic emission layer 118 is formed of a polymer organic material, an HTL may be stacked on the organic emission layer 118. The HTL may be formed of poly-(3,4)-ethylene-dihydroxy thiophene (PEDOT), polyaniline (PANI), or the like. In this regard, available organic materials may be a poly-phenylenevinylene (PPV)-based material and a polyfluorene-based polymer material. In addition, an inorganic material may be further deposited between the organic emission layer 118, the first pixel electrode 114, and an opposite electrode 119.

The opposite electrode 119 as a common electrode is deposited on the organic emission layer 118. In the FIG. 1 embodiment, the first pixel electrode 114 is used as an anode, and the opposite electrode 119 is used as a cathode. Obviously, polarities of the first pixel electrode 114 and the opposite electrode 119 may be opposite thereto.

The opposite electrode 119 may be a reflection electrode including a reflection material. In this regard, the opposite electrode 119 may include at least one material selected from the group consisting of aluminum (Al), magnesium (Mg), lithium (Li), calcium (Ca), lithium fluoride/calcium (LiF/Ca), and lithium fluoride/aluminum (LiF/Al).

The opposite electrode 119 is disposed as a reflection electrode so that light emitted from the organic emission layer 118 is reflected from the opposite electrode 119, transmits through the first pixel electrode 114, and is emitted towards the substrate 10.

The capacitor region CAP1 includes a lower electrode 312a and a first upper electrode 314 of a capacitor which are disposed on the substrate 10 and the buffer layer 11. The lower electrode 312a may be formed of the same material as that of the active layer 212 of the thin film transistor. The first upper electrode 314 may be formed of a transparent conductive material that is the same as that of the first pixel electrode 114. A portion of the first insulating layer 13 is formed between the lower electrode 312a and the first upper electrode 314.

In one embodiment, the lower electrode 312a is formed of the same material as that of the source region 212a and the drain region 212b, for example, a semiconductor material doped with an ion impurity. When the lower electrode 312a is formed of an intrinsic semiconductor material that is not doped with an ion impurity, the capacitor has a metal oxide semiconductor (MOS) CAP structure together with the first upper electrode 314. However, when the lower electrode 312a is formed of a semiconductor material doped with an ion impurity, as in FIG. 1, the capacitor constitutes a metal-insulator-metal (MIM) CAP structure having a larger capacitance than that of the MOS CAP structure so that a capacitance is maximized. Thus, the MIM CAP structure may have the same capacitance as that of the MOS CAP structure with a smaller area than that of the MOS CAP structure. Thus, a margin for decreasing the area of the capacitor increases and the thickness of the first pixel electrode 114 increases by the increased margin, which may increase an aperture ratio.

In one embodiment, a wiring W1 is disposed at a perimeter of the lower electrode 312a and is disposed on the same layer as the lower electrode 312a, is connected to the lower electrode 312a, and transmits a signal (current/voltage). The wiring W1 may include a semiconductor material doped with an ion impurity, similar to the lower electrode 312a.

In one embodiment, the first insulating layer 13 is disposed on the lower electrode 312a, and a region in which the first insulating layer 13 is not formed is at the perimeter of the lower electrode 312a. At least a portion the lower electrode 312a (e.g., an edge) may not be covered by the first insulating layer 13. The region in which the first insulating layer 13 is not formed may be a portion of the wiring W1 connected to the lower electrode 312a. For example, the region in which the first insulating layer 13 is not formed may be a connection portion in which the lower electrode 312a and the wiring W1 are connected to each other.

In the present embodiment, the region in which the first insulating layer 13 is not formed has been described as a portion of the wiring W1. The region in which the first insulating layer 13 is not formed may be an edge of the lower electrode 312a. This is because a boundary between the lower electrode 312a and the wiring W1 may not be clearly designed in the capacitor region CAP1. In the present embodiment, the region in which the first insulating layer 13 is not formed may be between the first insulating layer 13 and the wiring W1 disposed at a perimeter of the lower electrode 312a while forming a gap G between the first insulating layer 13 and the wiring W1. This is because, when the second insulating layer 15 is etched, the first insulating layer 13 is etched together with the second insulating layer 15.

The first upper electrode 314 is disposed on the first insulating layer 13. The first upper electrode 314 may be formed of the same material as that of the first pixel electrode 114. For example, when the first pixel electrode 114 includes a transparent conductive material, the first upper electrode 314 may also include the transparent conductive material.

The second insulating layer 15 is disposed on the first insulating layer 13. The second insulating layer 15 includes a second contact hole C2 through which the first upper electrode 314 is exposed. The second contact hole C2 may have a larger opening than the width of the first upper electrode 314. In addition, the second insulating layer 15 is not formed at the perimeter of the lower electrode 312a, like in the first insulating layer 13 described above. At least a portion of the lower electrode 312a (e.g., an edge) and at least a portion of the upper electrode 314 (e.g., an edge) may not be covered by the second insulating layer 15.

The third insulating layer 17 is disposed on the second insulating layer 15. The third insulating layer 17 may be formed as an organic insulating layer. The third insulating layer 17 including an organic insulating material having a low dielectric constant is interposed between the opposite electrode 119 and the first upper electrode 314. Thus, parasitic capacitances that may be formed between the opposite electrode 119 and the first upper electrode 314 are reduced and signal disturbance caused by the parasitic capacitances is prevented.

Figure 2:
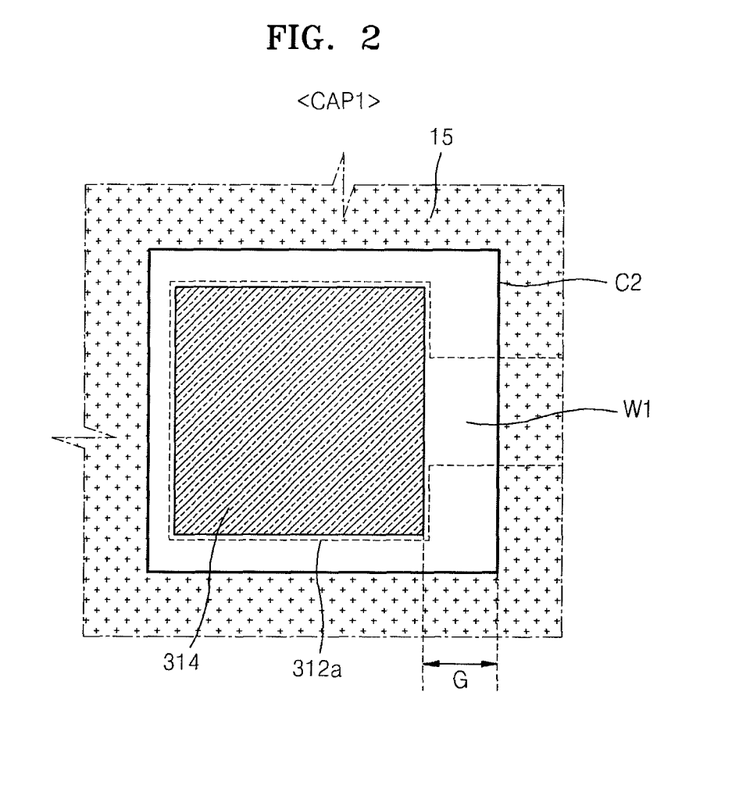
FIG. 2 is a schematic plane view of a capacitor region of the organic light-emitting display illustrated in FIG. 1 according to an embodiment.

FIG. 2 is a schematic plane view of the capacitor region CAP1 of the organic light-emitting display 1 illustrated in FIG. 1 according to an embodiment.

Referring to FIG. 2, the first upper electrode 314, the first insulating layer 13 having the gap G, and the second contact hole C2 through which a perimeter of the lower electrode 312a is exposed are disposed in the second insulating layer 15 of the capacitor region CAP1.

A region of the lower electrode 312a in which an ion impurity is to be doped and the wiring W1 connected to the lower electrode 312a on the same layer on which the lower electrode 312a is disposed depend on the size of a region of the second insulating layer 15 in which the second contact hole C2 is to be formed. In this regard, a region in which a semiconductor material is not doped with an ion impurity may be in a connection portion by which the lower electrode 312a and the wiring W1 are connected to each other, which will be described below (see FIGS. 12 through 14). In this case, since the region in which a semiconductor material is not doped with an ion impurity has a high resistance, capacitances may be reduced, or the quality of signal transmission may be lowered. However, in the present embodiment, the second contact hole C2 has a larger opening than the width of the first upper electrode 314. Thus, the lower electrode 312a and the wiring W1 are doped with ion impurities. Thus, the region of the semiconductor material in which an ion impurity is not doped is not between the lower electrode 312a and the wiring W1 so that capacitances increase and the quality of signal transmission is improved.

Figure 7:
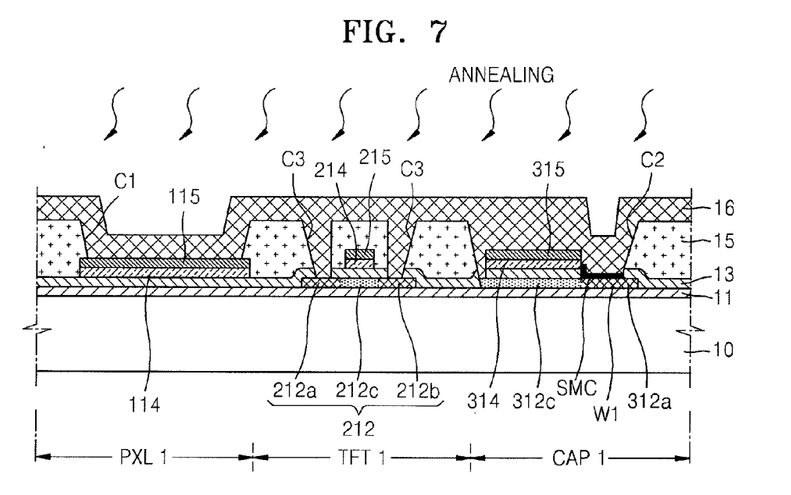
FIGS. 7 through 9 are schematic cross-sectional views of a fourth mask process of the method of manufacturing the organic light-emitting display illustrated in FIG. 1.
Figure 8:
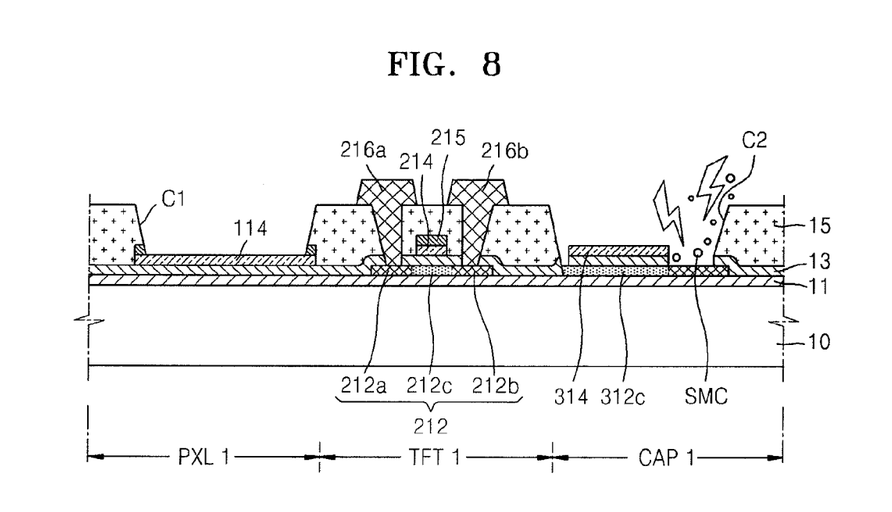

When the second contact hole C2 is formed, due to a reaction of metal included in the lower electrode 312a including the semiconductor material, the source electrode 216a, and the drain electrode 216b, a silicon-metal compound may be formed (see FIGS. 7 and 8). However, in the present embodiment, the silicon-metal compound is removed by a dry-etching process that will be described below, and a leakage current may be prevented from being generated between the lower electrode 312a and the first upper electrode 314 du to the silicon-metal compound.

FIG. 2 illustrates the case that an additional wiring is not connected to the first upper electrode 314. Thus, although not shown in FIG. 2, a wiring, such as the wiring W1 connected to the lower electrode 312a, may be further connected to at least one side of the first upper electrode 314.

Hereinafter, a method of manufacturing the organic light-emitting display 1 will be described with reference to FIGS. 3 through 10.

Figures 3, 4:
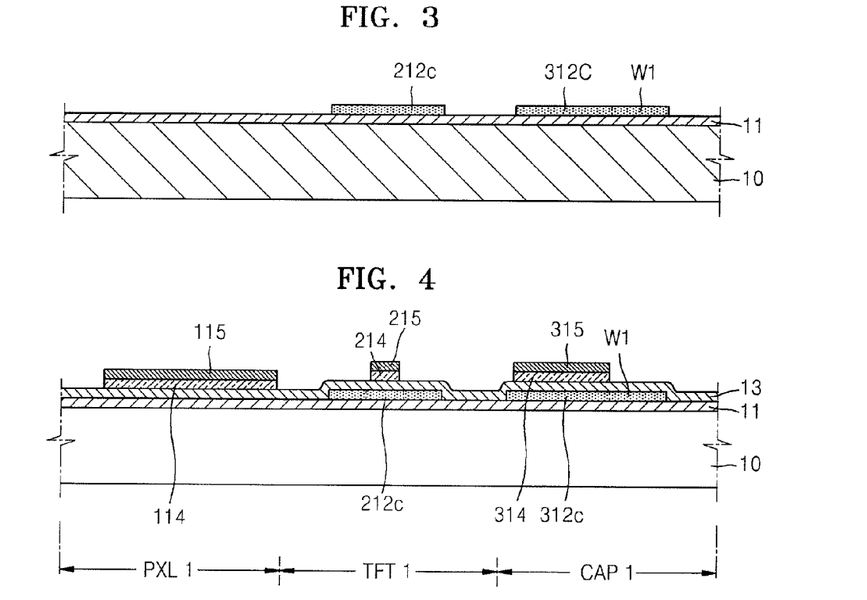
FIG. 3 is a schematic cross-sectional view illustrating the result of a first mask process of the method of manufacturing the organic light-emitting display illustrated in FIG. 1.
FIG. 4 is a schematic cross-sectional view illustrating the result of a second mask process of the method of manufacturing the organic light-emitting display illustrated in FIG. 1.

FIG. 3 is a schematic cross-sectional view illustrating the result of a first mask process of the method of manufacturing the organic light-emitting display 1 illustrated in FIG. 1.

Referring to FIG. 3, the active layer 212c of a thin film transistor and a capacitor lower electrode 312c are formed on the substrate 10 on which the buffer layer 11 is stacked. When a first mask process is performed, the wiring W1 connected to the capacitor lower electrode 312c is formed together with the capacitor lower electrode 312c.

The substrate 10 may be formed of a transparent glass material of which a main component is $SiO_2$. Obviously, the substrate 10 may be a plastic substrate formed of polyethylene terephthalate (PET), polyethylene naphthalate (PEN), polyimide, or the like, as well as a glass substrate.

The buffer layer 11, including, for example, $SiO_2$ and/or SiNx so as to maintain smoothness of the substrate 10 and to prevent penetration of impurity elements into the substrate 10, may be further disposed on the substrate 10.

Although not shown, a semiconductor layer (not shown) is deposited on the buffer layer 11, a photoresist (not shown) is applied onto the semiconductor layer (not shown), and the semiconductor layer (not shown) is patterned by a photolithography process using a first photomask (not shown), to substantially simultaneously form the active layer 212 of a thin film transistor, the capacitor lower electrode 312c, and the wiring W1.

The first mask process using photolithography is performed by exposing the first photomask (not shown) with an exposure unit (not shown) and performing a series of processes, such as developing, etching, and stripping or ashing.

The semiconductor layer (not shown) may be formed of amorphous silicon or polysilicon. In this case, polysilicon may also be formed by crystallizing amorphous silicon. Amorphous silicon may be crystallized by using various methods, such as rapid thermal annealing (RTA), solid phase crystallization (SPC), excimer laser annealing (ELA), metal-induced crystallization (MIC), metal-induced lateral crystallization (MILC), sequential lateral solidification (SLC), and the like.

FIG. 4 is a schematic cross-sectional view illustrating the result of a second mask process of the method of manufacturing the organic light-emitting display 1 illustrated in FIG. 1;

Referring to FIG. 4, the first insulating layer 13 is stacked on a resultant structure of the first mask process of FIG. 3, and layers (not shown) including a transparent conductive material and a first metal are sequentially stacked on the first insulating layer 13. Then, the layers (not shown) including a transparent conductive material and a first metal are simultaneously patterned.

As a result of patterning, the first pixel electrode 114 including a transparent conductive material and the second pixel electrode 115 including a metal are sequentially formed in the pixel region PXL1 of the first insulating layer 13. In addition, the first gate electrode 214 including a transparent conductive material and the second gate electrode 215 including a first metal are sequentially formed in the transistor region TFT1, and a first upper electrode 314, which includes a transparent conductive material, of a capacitor and a second upper electrode 315, which includes a first metal, of the capacitor are simultaneously formed in the capacitor region CAP1.

As described above, the first insulating layer 13 may include a single layer or a plurality of layers formed of $SiO_2$, SiNx, or the like. The first insulating layer 13 serves as a gate insulating layer of a thin film transistor and a dielectric layer of a capacitor.

The first pixel electrode 114, the first gate electrode 214, and the first upper electrode 314 may be formed of the same transparent conductive material.

The second pixel electrode 115, the second gate electrode 215, and the second upper electrode 315 may be formed of the same metal material and may be formed as a single layer or a plurality of layers formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

Figure 5:
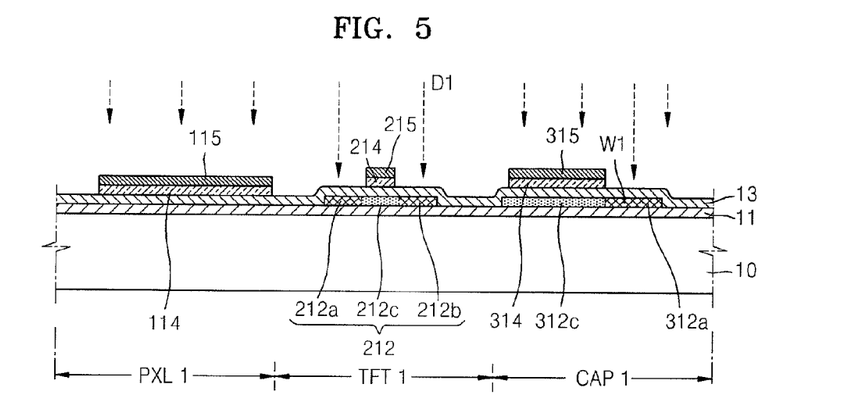
FIG. 5 is a schematic cross-sectional view illustrating the result of first doping after the second mask process of the method of manufacturing the organic light-emitting display illustrated in FIG. 1.

FIG. 5 is a schematic cross-sectional view illustrating the result of first doping after the second mask process of the method of manufacturing the organic light-emitting display 1 illustrated in FIG. 1.

Referring to FIG. 5, an ion impurity is firstly doped (D1) on a resultant structure of the second mask process of FIG. 4. The active layer 212 of a thin film transistor and the wiring W1 of the capacitor, as targets, may be doped with the ion impurity at a concentration of about $1 \times 10^{15}$ atoms/$cm^2$. The ion impurity may be B or P ions. In this case, the active layer 212 is doped with an ion impurity by using the first gate electrode 214 and the second gate electrode 215 as a self-aligned mask so that the active layer 212 includes the source and drain regions 212a and 212b doped with an ion impurity and the channel region 212c interposed therebetween. That is, the first and second gate electrodes 214 and 215 are used as a self-aligned mask so that the source and drain regions 212a and 212b may be formed without using an additional photomask.

The capacitor lower electrode 312c that is formed of the same material as that of the active layer 212 is not doped with an ion impurity, like the channel region 212c, because the first and second upper electrodes 314 and 315 serve as a blocking mask. However, the wiring (W1 and 312a), which is connected to the capacitor lower electrode 312c and on which the first upper electrode 314 and the second upper electrode 315 are not formed, is doped with an impurity.

Figure 6:
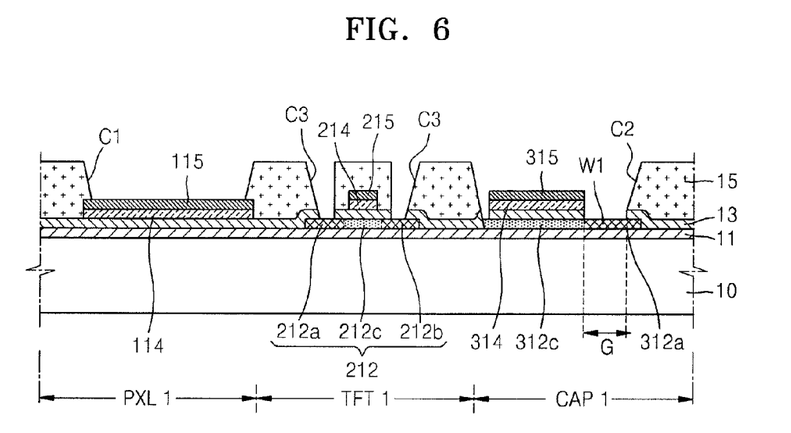
FIG. 6 is a schematic cross-sectional view illustrating the result of a third mask process of the method of manufacturing the organic light-emitting display illustrated in FIG. 1.

FIG. 6 is a schematic cross-sectional view illustrating the result of a third mask process of the method of manufacturing the organic light-emitting display 1 illustrated in FIG. 1.

Referring to FIG. 6, the second insulating layer 15 is stacked on a resultant structure of the second mask process of FIG. 5, and the first contact hole C1 through which the second pixel electrode 115 is exposed, the second contact hole C2 through which all of the first upper electrode 314 and the second upper electrode 315 are exposed, and the third contact hole C3 through which portions of the source region 212a and the drain region 212b of the active layer 212 are exposed are formed by patterning the second insulating layer 15.

Since the second contact hole C2 is formed to expose all of the first and second upper electrodes 314 and 315, a gap G is formed between the two upper electrodes 314 and 315 and the second contact hole C2. In this regard, a region in which the electrodes 314 and 315 are not formed, i.e., the first insulating layer 13 is etched together with the second insulating layer 15. Thus, the first and second insulating layers 13 and 15 may include the same etching surface, and a gap G in which the insulating layers 13 and 15 are not formed is formed between the etching surface and the capacitor lower electrode 312c.

Although the gap G is formed only between the first and second insulating layers 13 and 15, the gap G may be formed between the buffer layer 11 disposed below the insulating layers 13 and 15. This is because, when the insulating layers 13 and 15 are etched, the buffer layer 11 may also be etched.

Figure 9:
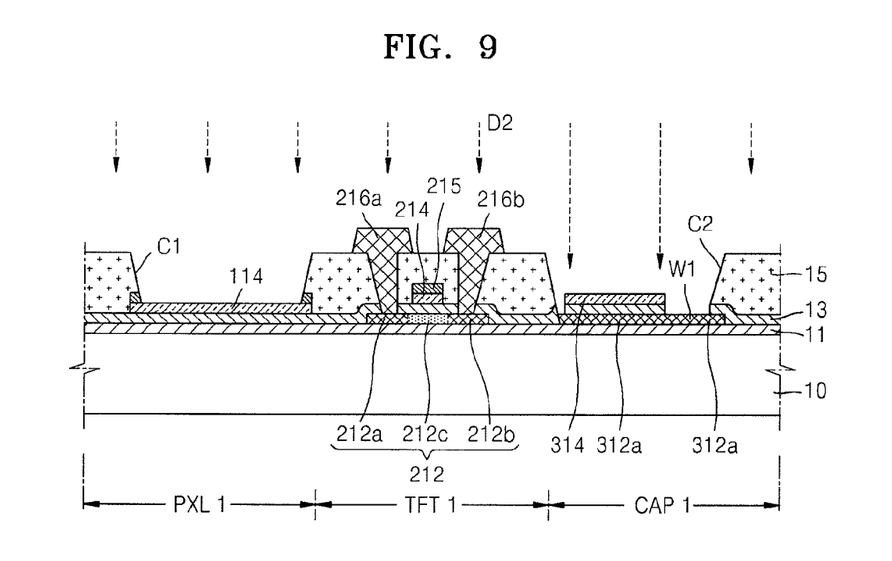

FIGS. 7 through 9 are schematic cross-sectional views of a fourth mask process of the method of manufacturing the organic light-emitting display 1 illustrated in FIG. 1.

FIG. 7 illustrates in case that a second metal 16 is stacked on a resultant structure of the third mask process of FIG. 6. The second metal 16 is stacked on the perimeter of the capacitor lower electrode 312c in which the first insulating layer 13 and the second insulating layer 15 are not formed, to fill the first contact hole C1, the second contact hole C2, and the third contact hole C3. An annealing process of the second metal 16 may be subsequently performed.

The second metal 16 may be formed as a single layer or a plurality of layers formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

In this regard, the second metal 16 directly contacts the wiring (W1 and 312a) that is disposed at the perimeter of the capacitor lower electrode 312c in which the first insulating layer 13 and the second insulating layer 15 are not formed. In this procedure, a silicon-metal compound (SMC), such as silicide, may be formed. When the SMC is not removed and remains, a leakage current may occur between the capacitor lower electrode 312c and the first upper electrode 314.

Although not shown in FIG. 7 in detail, a photoresist (not shown) may be disposed on the second metal 16, and a fourth photomask process is performed using a predetermined photomask (not shown).

FIG. 8 schematically illustrates the result of a fourth mask process. Referring to FIG. 8, the second metal 16 is patterned to form a source electrode 216a and a drain electrode 216b on the second insulating layer 15, and a portion of the second pixel electrode 115 and the whole second upper electrode 315 are removed.

When the second metal 16 used in forming the source and drain electrodes 216a and 216b and the metal used in forming the second pixel electrode 115 and the second upper electrode 315 are the same material, the portion of second pixel electrode 115 and the whole second upper electrode 315 are removed by performing an etching process using the same etchant once, thereby patterning to form the source and drain electrodes 216a and 216b. When the second metal 16 and the metal used in forming the second pixel electrode 115 and the second upper electrode 315 are different materials, the second metal 16 is etched using a first etchant, thereby patterning to form the source and drain electrodes 216a and 216b and removing the portion of second pixel electrode 115 and the whole second upper electrode 315 by using a second etchant. In this regard, the SMC that is formed in the wiring (W1, 312a) disposed at the perimeter of the capacitor lower electrode 312c in which the first insulating layer 13 and the second insulating layer 15 are not formed, may not be removed and may remain.

In the present embodiment, the SMC that is formed in the wiring (W1, 312a) disposed at the perimeter of the capacitor lower electrode 312c in which the first insulating layer 13 and the second insulating layer 15 are not formed, is removed. The SMC may be removed by dry-etching. Thus, a leakage current between the capacitor lower electrode 312c and the first upper electrode 314 may be prevented and a defect ratio may be reduced.

FIG. 9 schematically illustrates a second doping process after dry-etching has been performed.

Referring to FIG. 9, after the second pixel electrode 115 and the second upper electrode 315 have been removed, the capacitor lower electrode 312c is doped with an ion impurity, such as B or P ions, at an appropriate concentration.

The capacitor lower electrode 312c that has not been doped during first doping (D1) is changed into the lower electrode 312a doped with an ion impurity after the second doping so that the conductivity of the lower electrode 312a increases and the capacitance of the capacitor increase.

In addition, since the size of the second contact hole C2 formed in the second insulating layer 15 is greater than that of the second upper electrode 315, all of the lower electrode 312a and the wiring W1 are doped with an ion impurity. Thus, a reduction in capacitance and lowering of the quality of signal transmission may be prevented.

Referring to FIGS. 8 and 9, the second doping (D2) has been performed after dry-etching has been performed so as to remove the SMC. However, by changing the order of processes, dry-etching may also be performed so as to remove the SMC after the second doping (D2) has been completed.

Figure 10:
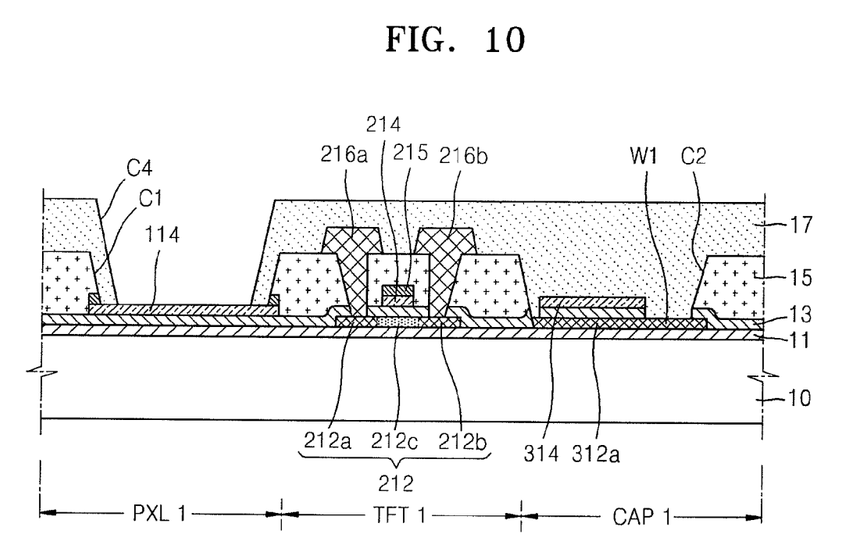
FIG. 10 is a schematic cross-sectional view illustrating the result of a fifth mask process of the method of manufacturing the organic light-emitting display illustrated in FIG. 1.

FIG. 10 is a schematic cross-sectional view illustrating the result of a fifth mask process of the method of manufacturing the organic light-emitting display 1 illustrated in FIG. 1.

Referring to FIG. 10, the third insulating layer 17 is formed on a resultant structure of the fourth mask process, and the fourth contact hole C4 through which the first pixel electrode 114 is exposed is formed by patterning the third insulating layer 17.

The fourth contact hole C4 is used to define an emission region and to prevent an electric field from concentrating on edges of the first and second pixel electrodes 114 and 115 by increasing a gap between the edges of the first and second pixel electrodes 114 and 115 and the opposite electrode 119 (see FIG. 1), thereby preventing a short circuit between the first and second pixel electrodes 114 and 115 and the opposite electrode 119.

Figure 11:
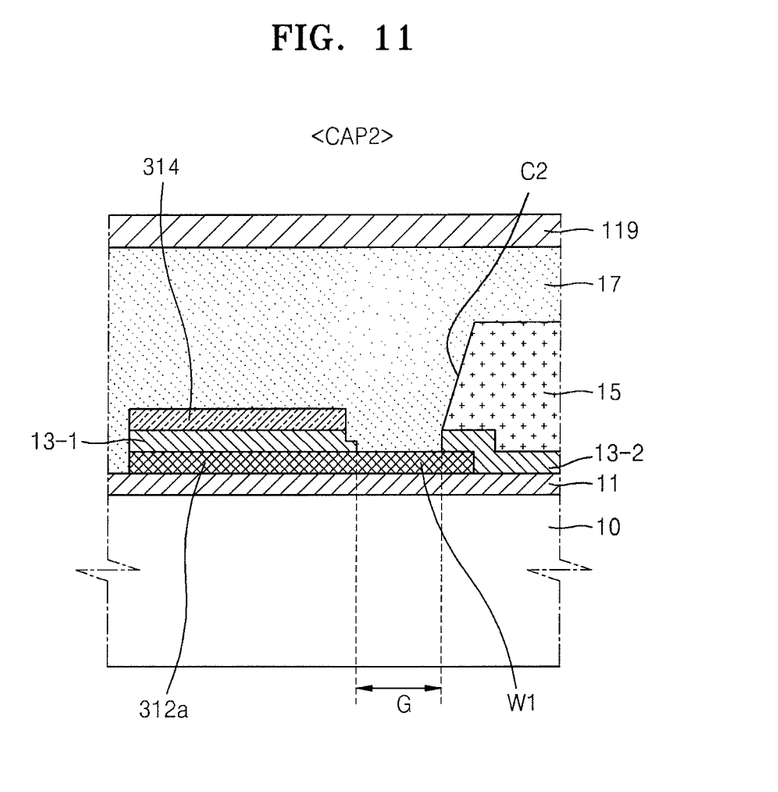
FIG. 11 is a schematic cross-sectional view of a capacitor region of the organic light-emitting display illustrated in FIG. 1 according to another embodiment.

FIG. 11 is a schematic cross-sectional view of a capacitor region CAP2 of the organic light-emitting display 1 illustrated in FIG. 1 according to another embodiment.

Referring to FIG. 11, in the capacitor region CAP2 according to the present embodiment, like in the capacitor region CAP1 illustrated in FIG. 2, the second contact hole C2 is formed to have a larger opening than the size of the first and second upper electrodes 314 and 315, and a first insulating layer 13-2 and the second insulating layer 15 are not formed on the wiring W1 disposed at the perimeter of the lower electrode 312a. In addition, all of the lower electrode 312a and the wiring W1 are doped with an ion impurity.

However, in the present embodiment, when the SMC formed in the wiring W1 disposed at the perimeter of the lower electrode 312a is dry-etched after the fourth mask process has been performed, a stepped portion is formed on an etching surface of the first insulating layer 13-2 formed between the lower electrode 312a and the first and second upper electrodes 314 and 315 according to the first insulating layer 13-2 or dry-etching. The stepped portion may cause a defect of voids that may occur in a contact surface between the first insulating layer 13-2 and the third insulating layer 17 when the third insulating layer 17 that contacts the etching surface of the first insulating layer 13-2 is an organic insulating layer, in particular.

Figure 12:
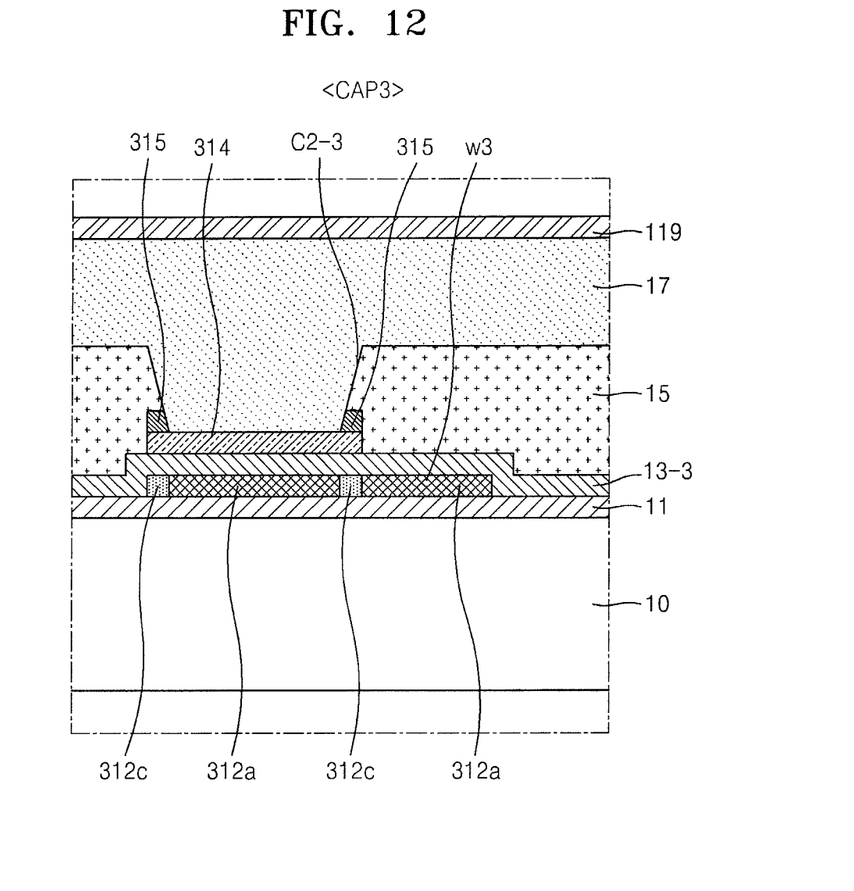
FIGS. 12 through 14 are schematic cross-sectional views and plane views of a capacitor region of the organic light-emitting display illustrated in FIG. 1, according to a comparative example.
Figure 13:
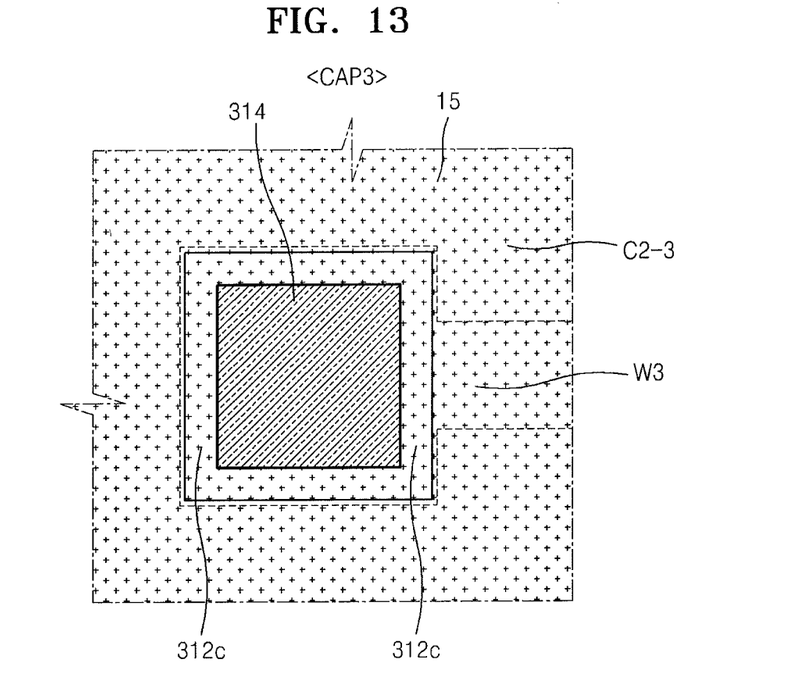
Figure 14:
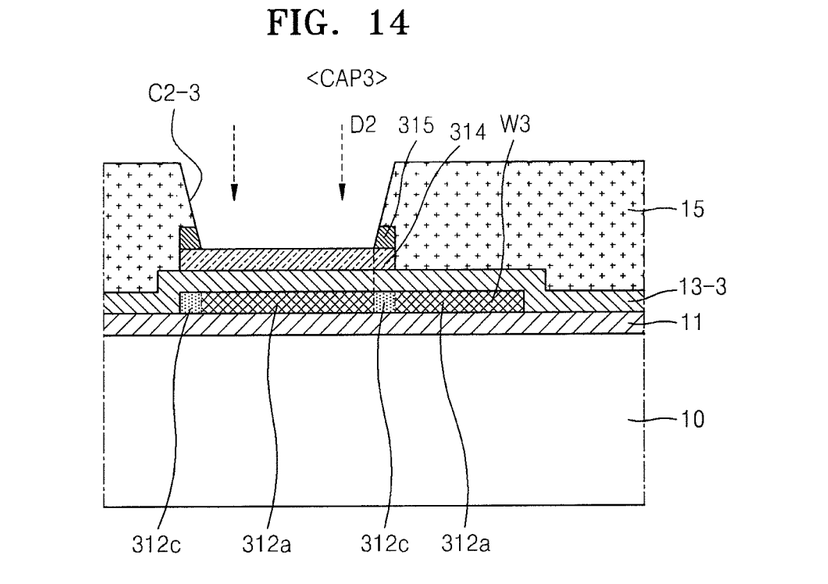

FIGS. 12 through 14 are schematic cross-sectional views and plane views of a capacitor region CAP3 of the organic light-emitting display 1 illustrated in FIG. 1 according to a comparative example.

Referring to FIGS. 12 and 13, in the capacitor region CAP3 according to the present embodiment, the lower electrode 312a and a wiring W3, a first insulating layer 13-3 that covers the lower electrode 312a and the wiring W3 consecutively, a first upper electrode 314, and a second upper electrode 315 that is disposed at the perimeter of the first upper electrode 314 are formed on the substrate 10 and the buffer layer 11.

According to the comparative example, a second contact hole C2-3 is formed in the second insulating layer 15 not to expose the entire portion of the first upper electrode 314 but so that portions of perimeters of the first upper electrode 314 and the second upper electrode 315 are covered. As a result, a portion of the second upper electrode 315 remains in a lower portion of the second insulating layer 15 in which the second contact hole C2-3 is formed.

FIG. 14 schematically illustrates a second doping (D2) to be performed after the fourth mask process has been performed in the capacitor region CAP3 of the organic light-emitting display according to the comparative example.

Referring to FIG. 14, since, when the second doping (D2) is performed, the second upper electrode 315 that remains covered by the second insulating layer 15 serves as a doping-preventing mask, the capacitor lower electrode 312c that corresponds to the second upper electrode 315 is not doped with an ion impurity.

Thus, in the capacitor region CAP3 of the organic light-emitting display 1 according to the comparative example, the region 312c that is not doped with an ion impurity may be at the perimeter of the lower electrode 312a. In this case, since the region 312c that is not doped with an ion impurity has a high resistance, capacitance may be reduced, or the quality of signal transmission may be lowered.

At least one of the disclosed embodiments provides the following benefits. Firstly, a phenomenon that an ion impurity is not doped on a lower electrode and a wiring region, is removed so that capacitance increases and the quality of signal transmission of a capacitor wiring is improved.

Secondly, since an impurity formed in a region in which an insulating layer disposed at a perimeter of a lower electrode is not disposed is removed, a leakage current between a first upper electrode and the lower electrode is prevented from occurring due to the impurity.

Thirdly, a MIM CAP structure having high capacitance is provided. Fourthly, the organic light-emitting display described above may be manufactured using five mask processes.

While the above embodiments have been described with reference to the accompanying drawings, it will be understood by those of ordinary skill in the art that various changes in form and details may be made therein without departing from the spirit and scope of the following claims.

What is claimed is:

1. A thin-film transistor array substrate comprising:
    a thin film transistor disposed on a substrate, wherein the thin film transistor comprises an active layer, a gate electrode, and source and drain electrodes;
    a capacitor comprising i) a lower electrode disposed on the same layer as the active layer and ii) an upper electrode disposed on the same layer as the gate electrode;

a pixel electrode disposed on the same layer as the gate electrode and the upper electrode, wherein the pixel electrode is electrically connected to at least one of the source and drain electrodes;

a first insulating layer disposed between the active layer and the gate electrode and between the lower and upper electrodes of the capacitor, wherein at least a portion of the lower electrode is not covered by the first insulating layer;

a second insulating layer disposed between the first insulating layer and the source and drain electrodes, wherein at least a portion of the upper and lower electrodes is not covered by the second insulating layer; and a third insulating layer substantially covering the source and drain electrodes and the upper electrode, wherein at least part of the pixel electrode is not covered by the third insulating layer.

2. The thin-film transistor array substrate of claim 1, wherein each of the active layer and the lower electrode is formed of a semiconductor material doped with an ion impurity.

3. The thin-film transistor array substrate of claim 1, wherein the gate electrode comprises i) a first layer formed of a transparent conductive material and ii) a second layer formed of metal.

4. The thin-film transistor array substrate of claim 1, wherein each of the pixel electrode and the upper electrode is formed of a transparent conductive material.

5. The thin-film transistor array substrate of claim 4, wherein the transparent conductive material comprises at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

6. The thin-film transistor array substrate of claim 1, wherein the first and second insulating layers comprise the same etching surface.

7. The thin-film transistor array substrate of claim 6, wherein a gap is formed between the etching surface and the lower electrode.

8. The thin-film transistor array substrate of claim 7, wherein the third insulating layer is disposed in the gap.

9. The thin-film transistor array substrate of claim 7, wherein a stepped portion is formed on the etching surface of the first insulating layer interposed between the upper and lower electrodes.

10. The thin-film transistor array substrate of claim 1, wherein the third insulating layer directly contacts a perimeter of the lower electrode in which the first and second insulating layers are not disposed.

11. The thin-film transistor array substrate of claim 1, wherein each of the first and second insulating layers is formed of an organic insulating material.

12. The thin-film transistor array substrate of claim 1, wherein the third insulating layer is formed of an organic insulating material.

13. The thin-film transistor array substrate of claim 1, wherein a wiring is disposed on the same layer as the lower electrode and is connected to the lower electrode, and wherein the first insulating layer is not formed on a connection portion in which the lower electrode and the wiring are connected to each other.

14. The thin-film transistor array substrate of claim 13, wherein each of the wiring and the connection portion is formed of a semiconductor material doped with an ion impurity.

15. An organic light-emitting display comprising:

a thin film transistor disposed on a substrate, wherein the thin film transistor comprises an active layer, a gate electrode, and source and drain electrodes;

a capacitor comprising i) a lower electrode disposed on the same layer as the active layer and ii) an upper electrode disposed on the same layer as the gate electrode;

a pixel electrode disposed on the same layer as the gate electrode and the upper electrode, wherein the pixel electrode is electrically connected to at least one of the source and drain electrodes;

a first insulating layer disposed between the active layer and the gate electrode and between the lower electrode and the upper electrode, wherein at least a portion of the lower electrode is not covered by the first insulating layer;

a second insulating layer between the first insulating layer and the source and drain electrodes, wherein at least a portion of the upper and lower electrodes is not covered by the second insulating layer;

a third insulating layer substantially covering the source and drain electrodes and the upper electrode, wherein at least a portion of the pixel electrode is not covered by the third insulating layer;

an organic emission layer disposed on the pixel electrode; and an opposite electrode disposed on the organic emission layer.

16. The organic light-emitting display of claim 15, wherein the opposite electrode is a reflection electrode that reflects light emitted from the organic emission layer.

17. The organic light-emitting display of claim 15, wherein the third insulating layer directly contacts a perimeter of the lower electrode in which the first and second insulating layers are not disposed.

18. The organic light-emitting display of claim 15, wherein the lower electrode is formed of a semiconductor material doped with an ion impurity, and wherein a region that is not doped with an ion impurity is formed between i) the lower electrode in which the first insulating layer is disposed and ii) a perimeter of the lower electrode in which the first insulating layer is not disposed.

* * * * *